(12) United States Patent
Satoh

(10) Patent No.: US 8,198,946 B2
(45) Date of Patent: Jun. 12, 2012

(54) SEMICONDUCTOR INTEGRATED CIRCUIT AND RADIO COMMUNICATION APPARATUS

(75) Inventor: Yuji Satoh, Nagareyama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 12/886,694

(22) Filed: Sep. 21, 2010

(65) Prior Publication Data

US 2011/0227656 A1      Sep. 22, 2011

(30) Foreign Application Priority Data

Mar. 18, 2010    (JP) .................................. 2010-62691

(51) Int. Cl.
*H03K 3/03*      (2006.01)
(52) U.S. Cl. ............................. 331/74; 331/57; 330/149
(58) Field of Classification Search ................... 331/57, 331/74, 175; 330/149
See application file for complete search history.

(56) References Cited

U.S. PATENT DOCUMENTS

2010/0289588  A1    11/2010   Satoh

FOREIGN PATENT DOCUMENTS

| JP | 09-246921 | 9/1997 |
|---|---|---|
| JP | 2006-339871 | 12/2006 |

OTHER PUBLICATIONS

Bansal, et al. 2GHz CMOS Noise Cancellation VCO, IEEE Asian Solid-State Circuits Conference, Nov. 3-5, 2008, pp. 461-464.

*Primary Examiner* — James E Goodley
(74) *Attorney, Agent, or Firm* — Turocy & Watson, LLP

(57) ABSTRACT

A semiconductor integrated circuit includes a ring oscillator and a noise canceller. The ring oscillator includes first and second signal generators. The first signal generator is configured to generate a first output signal having a first phase based on an input signal. The second signal generator is configured to generate a second output signal having a second phase different from the first phase based on the input signal. The noise canceller includes first and second amplifiers and an arithmetic module. The first amplifier is configured to amplify the first output signal generated by the first signal generator using a first amplification factor. The second amplifier is configured to amplify the second output signal generated by the second signal generator using a second amplification factor. The arithmetic module is configured to combine the first output signal amplified by the first amplifier with the second output signal amplified by the second amplifier.

20 Claims, 6 Drawing Sheets

SEMICONDUCTOR INTEGRATED CIRCUIT AND RADIO COMMUNICATION APPARATUS

CROSS REFERENCE TO RELATED APPLICATIONS

This application is based upon and claims the benefit of priority from the prior Japanese Patent Application No. 2010-62691, filed on 18 Mar. 2010, the entire contents of which are incorporated herein by reference.

FIELD

The present invention relates to a semiconductor integrated circuit and a radio communication apparatus.

BACKGROUND

Recently, a ring oscillator in which a single end is adopted is mounted in a SOC (System-On-a-Chip) system. Ordinarily, the ring oscillator includes a transistor such as a CMOS (Complementary-Metal-Oxide-Semiconductor) transistor and a bipolar transistor, odd-number inverters cascade-connected, and a current source or a voltage source including a transistor and a battery.

However, a noise component such as a flicker noise and a thermal noise is mixed in a signal generated by the current source or the voltage source of the ring oscillator. The flicker noise caused by the transistor tends to emerge in a low frequency band and is inversely proportional to a frequency. The thermal noise is caused by random thermal motions of carriers (electrons) and independent of the frequency. The noise component adversely affects the frequency of the signal oscillated by the single-end oscillator included in the ring structure.

On the other hand, a differential ring oscillator that oscillates a signal corresponding to a difference between two signal components is well known as a device to reduce the noise component. The differential ring oscillator includes two output terminals. There is a phase difference n between the two signals output from the tow output terminals. In other words, in the differential ring oscillator, a potential at one of the output terminals is lowered when a potential at the other output terminal is raised.

However, in the differential ring oscillator, ordinarily, it is necessary to avoid in-phase oscillation and sticking of in-phase potential. The in-phase oscillation means that a phase difference between the two output signals becomes zero. The sticking of in-phase potential means that each of the two output signals freezes at a stabilization point such as a power supply or a ground. In order to avoid the in-phase oscillation and the sticking of in-phase potential, the conventional differential ring oscillator includes a complicated circuit that prevents the oscillation of the output signal. Therefore, a circuit size and a consumption current are increased, and circuit design is difficult to establish.

That is, in the conventional differential ring oscillator, the noise component of the output signal is hardly reduced without increasing the circuit size and the consumption current (see JP-A No. 2006-339871 (Kokai) and "2 GHz CMOS Noise Cancellation VCO" written by Amit Bansal and Chun-Huat Heng, and IEEE Asian Solid-State Circuits Conference Nov. 3-5, 2008, page 461 to 464). Further, the noise component of the output signal is hardly reduced using a simple circuit whose circuit design is easy to establish. In other words, there is a trade-off relationship between the reduction of the noise component and the improvements in circuit performance (e.g. the reduction of the circuit size and the consumption current, and the simplification of the circuit design).

DETAILED DESCRIPTION

Embodiments will now be explained with reference to the accompanying drawings.

In general, according to one embodiment, a semiconductor integrated circuit includes a ring oscillator and a noise canceller. The ring oscillator includes a first signal generator and a second signal generator. The first signal generator is configured to generate a first output signal having a first phase based on an input signal. The second signal generator is configured to generate a second output signal having a second phase different from the first phase based on the input signal. The noise canceller includes a first amplifier, a second amplifier, and an arithmetic module. The first amplifier is configured to amplify the first output signal generated by the first signal generator using a first amplification factor. The second amplifier is configured to amplify the second output signal generated by the second signal generator using a second amplification factor. The arithmetic module is configured to combine the first output signal amplified by the first amplifier with the second output signal amplified by the second amplifier.

Figure 1:
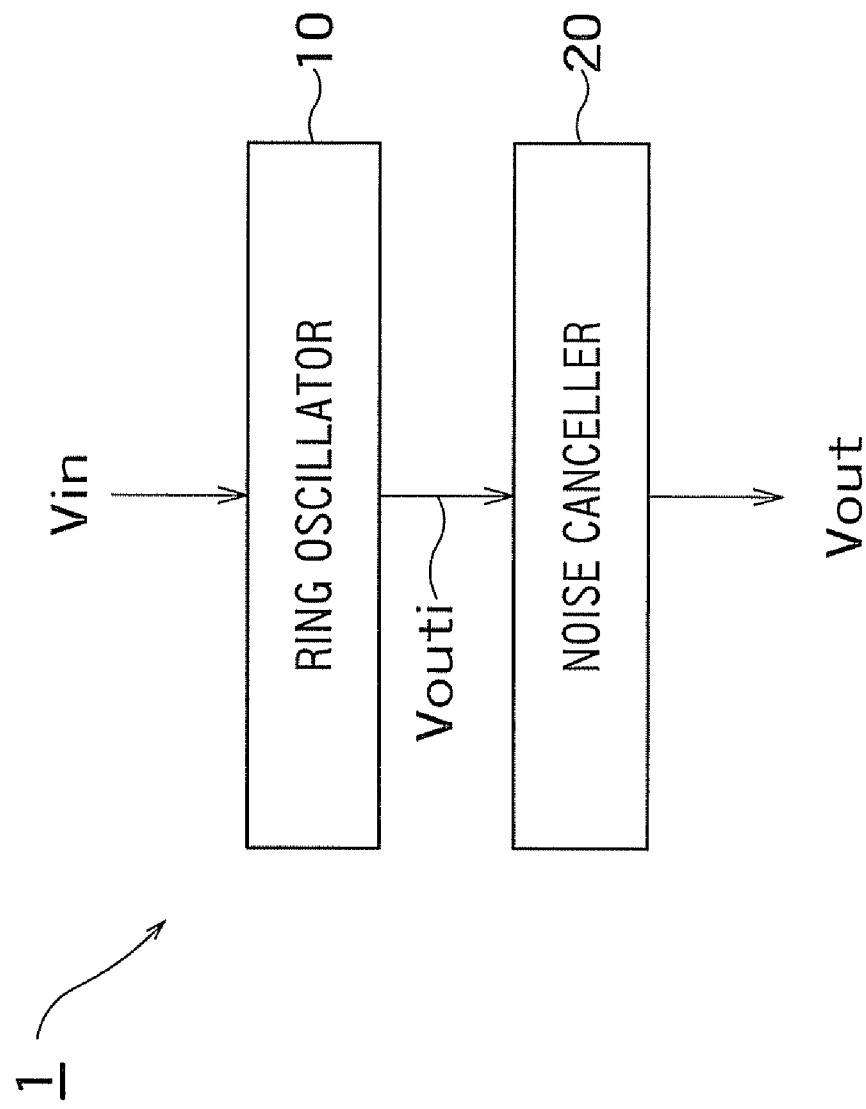
FIG. 1 is a block diagram illustrating a configuration of the semiconductor integrated circuit 1 of the present embodiment.
Figure 2:
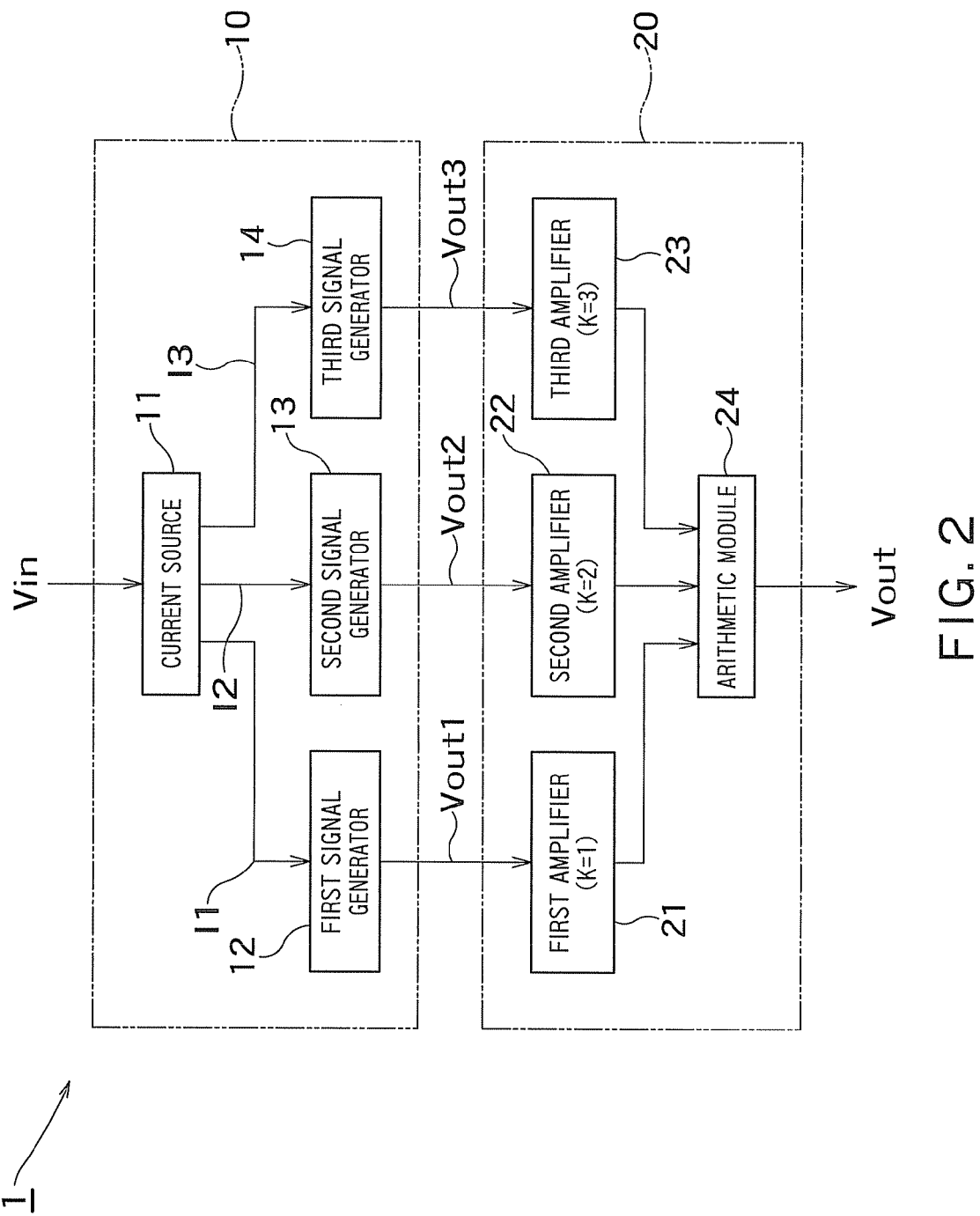
FIG. 2 is a block diagram illustrating a detailed configuration of the semiconductor integrated circuit 1 of FIG. 1.

A semiconductor integrated circuit according to a present embodiment will be explained below. FIG. 1 is a block diagram illustrating a configuration of the semiconductor integrated circuit 1 of the present embodiment. FIG. 2 is a block diagram illustrating a detailed configuration of the semiconductor integrated circuit 1 of FIG. 1.

Referring to FIG. 1, the semiconductor integrated circuit 1 includes a ring oscillator 10 and a noise canceller 20.

The ring oscillator 10 of FIG. 1 is configured to generate n (n is an odd-number integer of at least three) output signals Vouti (i is an integer of 1 to n) having predetermined phases based on an input signal Vin.

The noise canceller 20 of FIG. 1 is configured to cancel a noise of the output signal Voutn generated by the ring oscillator 10 to generate an output signal Vout. For example, the output signal Vout is supplied to a radio communication module such as a CRW (Clock Rest Watchdog) 4 of FIG. 8.

Referring to FIG. 2, the ring oscillator 10 includes a current source 11 and a first signal generator 12 to a third signal generator 14. The ring oscillator 10 of the present embodiment may include at least four signal generators. The ring oscillator 10 is a differential ring oscillator. At least three signal generators are required to implement the ring oscillator 10. It is necessary that n be an odd number in order to oscillate a signal in the ring oscillator 10.

The current source 11 of FIG. 2 is configured to supply a first current I1 to a third current I3 to the first signal generator 12 to the third signal generator 14, respectively. The noise components such as the flicker noise and the thermal noise are mixed in the first current I1 to the third current I3. The noise component adversely affects the oscillation amplitude, oscillation frequency, and oscillation phase of the ring oscillator 10. For example, the current source 11 includes a transistor and a battery.

The first signal generator 12 of FIG. 2 is configured to generate a first output signal Vout1 having a first phase based on the input signal Vin.

The second signal generator 13 of FIG. 2 is configured to generate a second output signal Vout2 having a second phase based on the input signal Vin. The second phase is different from the first phase.

The third signal generator 14 of FIG. 2 is configured to generate a third output signal Vout3 having a third phase based on the input signal Vin. The third phase is different from the first and second phases.

That is, the ring oscillator 10 of FIG. 2 is configured to generate at least three output signals having at least two kinds of phases.

Referring to FIG. 2, the noise canceller 20 includes a first amplifier 21 to a third amplifier 23 and an arithmetic module 24. In the present embodiment, the noise canceller 20 includes as many amplifiers as the signal generators of the ring oscillator 10.

The first amplifier 21 of FIG. 2 is configured to amplify the first output signal Vout1 generated by the first signal generator 12 using a first amplification factor K1.

The second amplifier 22 of FIG. 2 is configured to amplify the second output signal Vout2 generated by the second signal generator 13 using a second amplification factor K2. A ratio of the first amplification factor K1 and the second amplification factor K2 is an integer.

The third amplifier 23 of FIG. 2 is configured to amplify the third output signal Vout3 generated by the third signal generator 14 using a third amplification factor K3. The third amplification factor K3 is an arbitrary value. That is, the third amplification factor K3 may be equal to the first amplification factor K1 or the second amplification factor K2, or may be different from the first amplification factor K1 and the second amplification factor K2.

The arithmetic module 24 of FIG. 2 is configured to combine the first output signal Vout1 amplified by the first amplifier 21, the second output signal Vout2 amplified by the second amplifier 22, and the third output signal Vout3 amplified by the third amplifier 23 to generate an output signal Vout. More specifically, the arithmetic module 24 performs addition (Vout1+Vout2+Vout3), subtraction (−Vout1−Vout2−Vout3), and addition-subtraction (for example, Vout1−Vout2+Vout3) to the first to third output signals Vout1 to Vout3.

Figure 3:
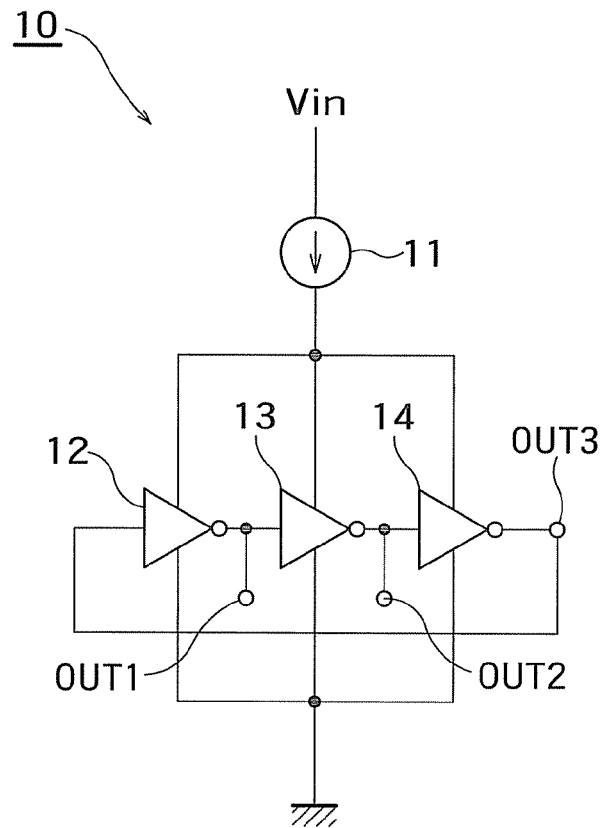
FIG. 3 is a circuit diagram of the ring oscillator 10 of FIG. 2.
Figure 4:
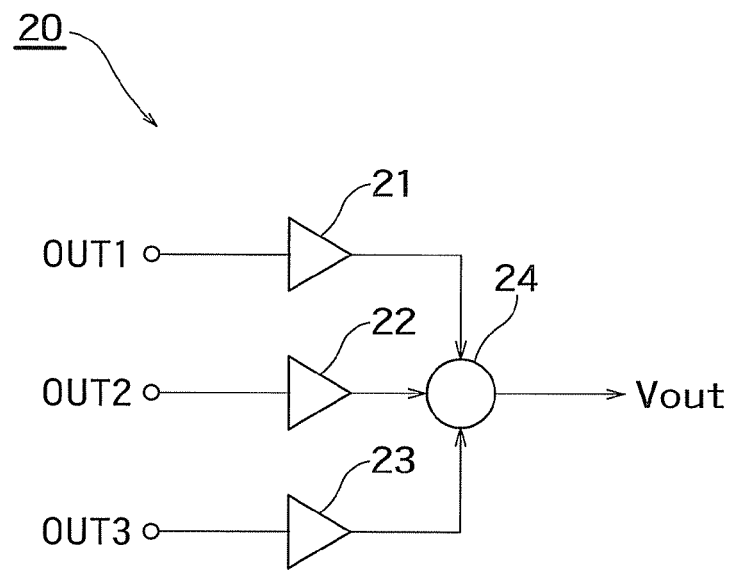
FIG. 4 is a circuit diagram of the noise canceller 20 of FIG. 2.
Figure 5:
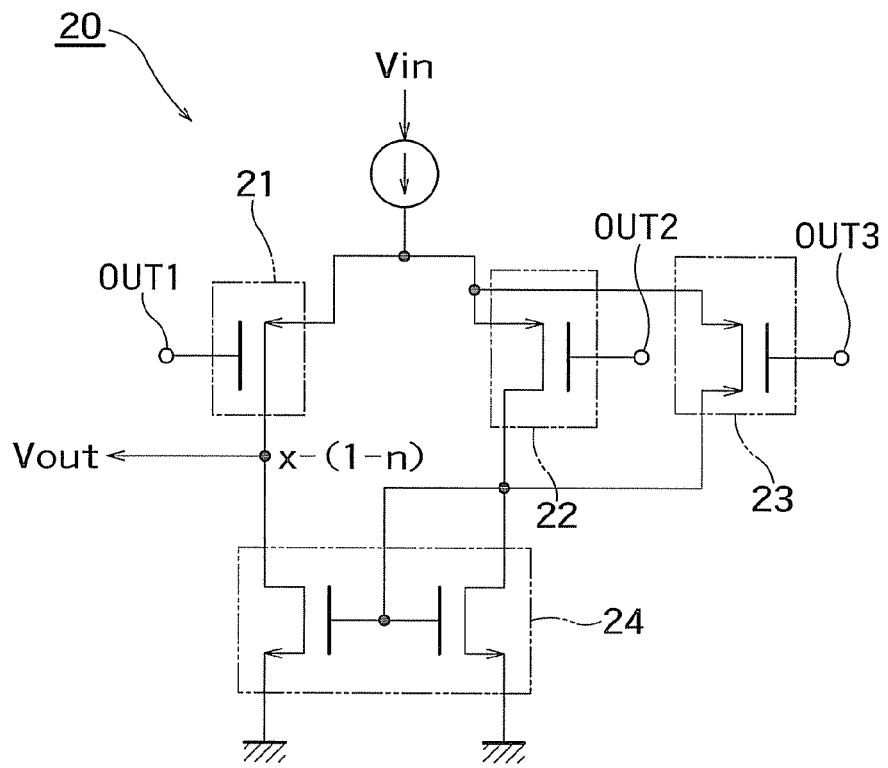
FIG. 5 is a circuit diagram of the noise canceller 20 of FIG. 4 in the case of K1:K2:K3=1−n:1:1.

Specific examples of the semiconductor integrated circuit of the present embodiment will be explained. FIG. 3 is a circuit diagram of the ring oscillator 10 of FIG. 2. FIG. 4 is a circuit diagram of the noise canceller 20 of FIG. 2. FIG. 5 is a circuit diagram of the noise canceller 20 of FIG. 4 in the case of K1:K2:K3=1−n:1:1.

As illustrated in FIG. 3, the ring oscillator 10 is an oscillator having a single-end configuration connected to at least three nodes (first to third nodes OUT1 to OUT3). The first node OUT1 is located between the first signal generator 12 and the second signal generator 13. The second node OUT2 is located between the second signal generator 13 and the third signal generator 14. The third node OUT3 is located between the third signal generator 14 and the first signal generator 12. The first signal generator 12 to third signal generator 14 are inverters that are connected to the current source 11 and the ground.

In the ring oscillator 10 of FIG. 3, the current source 11 generates the first current I1 to third current I3 corresponding to the input signal Vin. Then, the first signal generator 12 to the third signal generator 14 generate the first output signal Vout1 to the third output signal Vout3 corresponding to the first current I1 to the third current I3, respectively.

There is a phase difference $2\pi/n$ between the output signal Vouti of the node OUTi and the output signal Vouti−1 of the node OUTi−1. Accordingly, an oscillation component Voci of the output signal Vouti is expressed by an equation 1, where "t" is a time.

$$Voci = \sin\left(st + \frac{i\pi}{n}\right) \quad \text{(equation 1)}$$

The output signal Vouti is expressed by an equation 2, where VN(t) is a function expressing the noise component, A is amplitude of each of the first output signal Vout1 to the third output signal Vout3, $K_i$ is an amplification factor, and $\phi$ is a phase shift amount of each of the first output signal Vout1 to the third output signal Vout3 at t=0. A, $\phi$, and ω do not include the noise component.

$$\sum_{i=1}^{n} K_i Vouti = A\sin(\omega t + \phi) + 0 * VN(t) \quad \text{(equation 2)}$$

In the present embodiment, as a result of weighted computation, amplification factor $K_i$ is determined such that the equation 2 holds.

As illustrated in FIG. 4, the noise canceller 20 is connected to at least three nodes (first node OUT1 to third node OUT3). The first amplifier 21 is connected to the first node OUT1. The second amplifier 22 is connected to the second node OUT2. The third amplifier 23 is connected to the third node OUT3.

In the noise canceller 20 of FIG. 4, the first amplifier 21 to the third amplifier 23 amplify the first output signal Vout1 to the third output signal Vout3, respectively. Then, the arithmetic module 24 performs the addition, subtraction, or addition-subtraction to the first output signal Vout1 to the third output signal Vout3, thereby the output signal Vout is generated.

That is, the noise canceller 20 is configured to perform the weighted computation (the addition, subtraction, or addition-subtraction) to at least two nodes in the first node OUT1 to third node OUT3 of the ring oscillator 10 in order to cancel the influence of the noise component of the output signal Vout on the oscillation amplitude, oscillation frequency, and oscillation phase of the ring oscillator 10. The first amplification factor K1 to third amplification factor K3 of the first amplifier 21 to third amplifier 23 are determined such that the noise components of the first output signal Vout1 to third output signal Vout3 generated by the first signal generator 12 to third signal generator 14 cancel one another while the first output signal Vout1 to third output signal Vout3 do not completely cancel one another.

For example, in the case of "K1:K2:K3=1−n:1:1" in the noise canceller 20 of FIG. 4, a ratio of a first gate width W1 of the first amplifier 21, a second gate width W2 of the second amplifier 23, and a third gate width W3 of the third amplifier 24 becomes "W1:W2:W3=−(1−n):1:1=n−1:1:1" as illustrated in FIG. 5.

The semiconductor integrated circuit of the present embodiment includes the ring oscillator 10 and the noise canceller 20. The ring oscillator 10 includes the first signal generator 12 and the second signal generator 13. The first signal generator 12 generates the first output signal Vout1 having the first phase based on the input signal Vin. The second signal generator 13 generates the second output signal Vout2 having the second phase based on the input signal Vin. The noise canceller 20 includes the first amplifier 21, the second amplifier 22, and the arithmetic module 24. The first amplifier amplifies the first output signal Vout1 using the first amplification factor K1. The second amplifier 22 amplifies the second output signal Vout2 using the second amplification factor K2. The arithmetic module 24 combines the first output signal Vout1 and the second output signal Vout2. Therefore, the noise component of the output signal Vout can be reduced using the simple circuit without increasing the circuit size and the consumption current.

In the present embodiment, the ratio of the first amplification factor K1 and the second amplification factor K2 may be an integer. Therefore, the sizes of the elements such as a transistor, a resistor, and a capacitor, which constitute the semiconductor integrated circuit 1, can be unified, and the number of elements can be reduced. As a result, the semiconductor integrated circuit 1 can easily be designed in consideration of a mismatch variation. More specifically, because a simulation model of a transistor depends on the size of the transistor, the simulation conditions are easily set in the case where the ratio of the first amplification factor K1 and the second amplification factor K2 is an integer. As a result, the simulation is easily performed under the conditions close to an actual phenomenon.

In the present embodiment, the ring oscillator 10 may include a plurality of signal generators including the first signal generator 12 and second signal generator 13. The noise canceller 20 may include as many amplifiers as the plural signal generators including the first amplifiers 21 and second amplifiers 22. Therefore, all the output signals in all the signal generators of the ring oscillator 10 are available. As a result, power efficiency of the semiconductor integrated circuit 1 can be improved.

In the present embodiment, the ring oscillator 10 may include three signal generators (the first signal generator 12 to the third signal generator 14). The noise canceller 20 may include three amplifiers (the first amplifier 21 to the third amplifier 23). Therefore, a circuit area of the semiconductor integrated circuit can be shrunk.

In the present embodiment, "K1:K2:K3=1−n:1:1" may hold. Therefore, the semiconductor integrated circuit 1 having the minimum circuit area is implemented in order to reduce the noise component of the output signal Vout.

Figure 6:
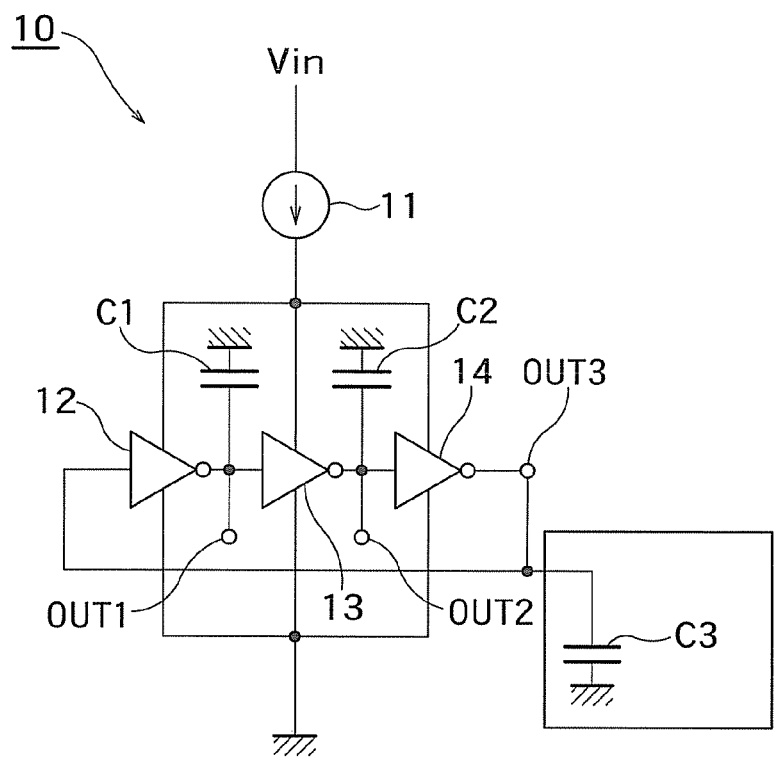
FIG. 6 is a circuit diagram of the ring oscillator 10 according to a first modification of the present embodiment.
Figure 7:
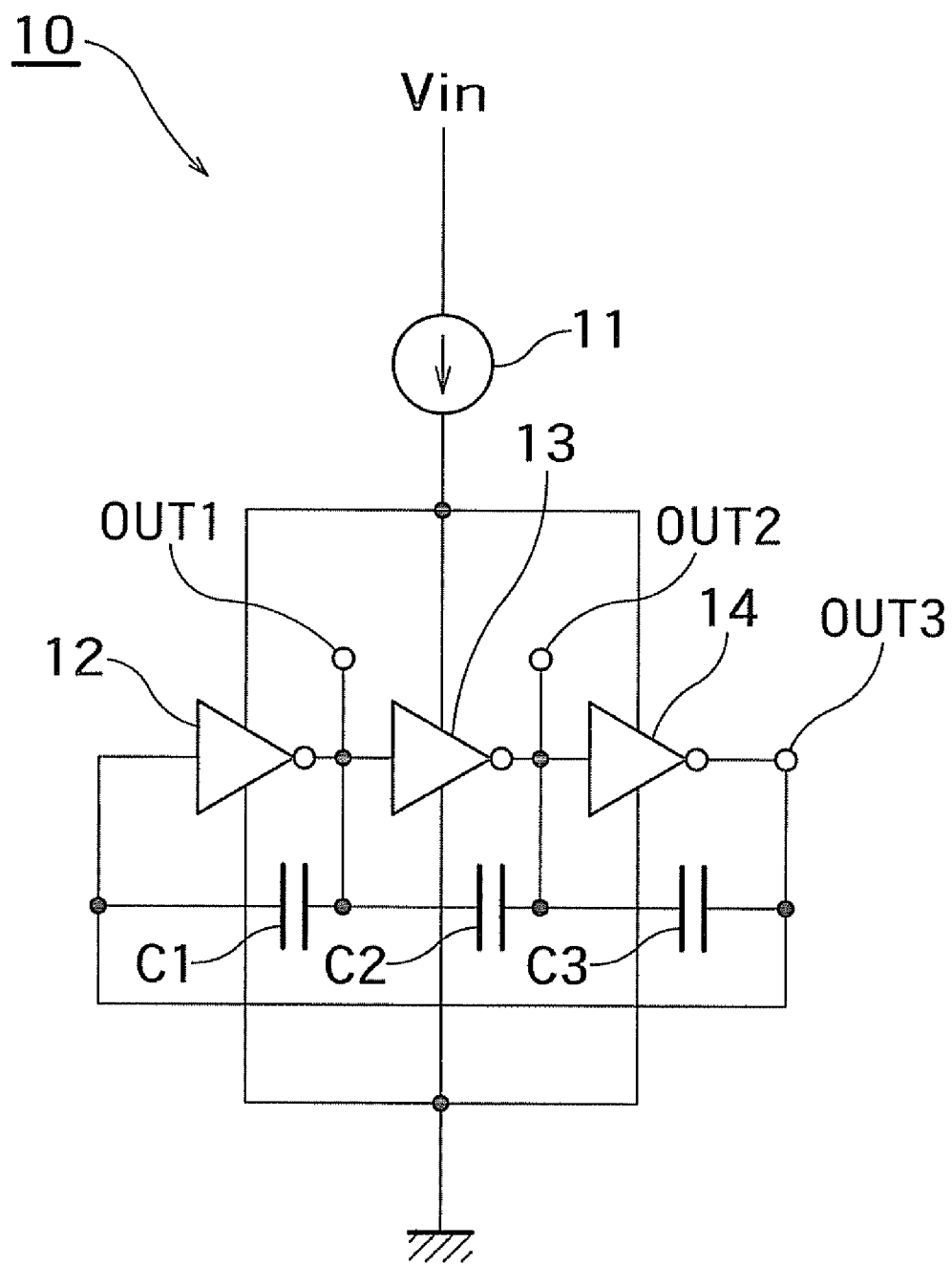
FIG. 7 is a circuit diagram of the ring oscillator 10 according to a second modification of the present embodiment.

Semiconductor integrated circuits according to modifications of the present embodiment will be explained below. FIG. 6 is a circuit diagram of the ring oscillator 10 according to a first modification of the present embodiment. FIG. 7 is a circuit diagram of the ring oscillator 10 according to a second modification of the present embodiment.

Referring to FIG. 6, in addition to the configuration similar to the ring oscillator 10 of FIG. 3, the ring oscillator 10 of the first modification includes a capacitor C1 connected between the first node OUT1 and the ground, a capacitor C2 connected between the second node OUT2 and the ground, and a capacitor C3 connected between the third node OUT3 and the ground.

In the first modification, the oscillation frequency of the signal can be stabilized at each node by suppressing the generation of the high frequency signal. This is because a frequency is, in general, proportional to a current while being inversely proportional to a capacitance.

In the first modification, a clock frequency of the output signal Vout can be lowered, thereby reducing the power consumption of the semiconductor integrated circuit 1. In FIG. 6, the capacitors C1 to C3 are grounded. However, the scope of the present invention is not limited to the first modification. The present invention can also be applied when the capacitors C1 to C3 of FIG. 6 are connected to a voltage source (not illustrated) of a bias voltage or a current source (not illustrated) of a bias current.

Referring to FIG. 7, in addition to the configuration similar to the ring oscillator 10 of FIG. 3, the ring oscillator 10 of the second modification includes the capacitor C1 connected in parallel with the first signal generator 12, the capacitor C2 connected in parallel with the second signal generator 13, and the capacitor C3 connected in parallel with the third signal generator 14.

In the second modification, compared with the first modification, the capacitance necessary to obtain the oscillation frequency of the signal at each node can be reduced in each of the capacitors C1 to C3. As a result, the area of the ring oscillator 10 is shrunk.

In the second modification, exchange of charges between the nodes can be transferred to each node. For example, that the first signal generator 12 charges the capacitor C1 is equivalent to the fact that a charge Q1 is transferred from the first node OUT1 to the capacitor C1 and the charge Q1 is transferred from the capacitor C1 to the third node OUT3. That is, when the first signal generator 12 charges the capacitor C1, the charge equivalent to that of the capacitor C1 is transferred between the first node OUT1 and the third node OUT3. Therefore, the exchange of the charge between the first node OUT1 and the third node OUT3 is transferred to the first node OUT1 and the third node OUT3.

Figure 8:
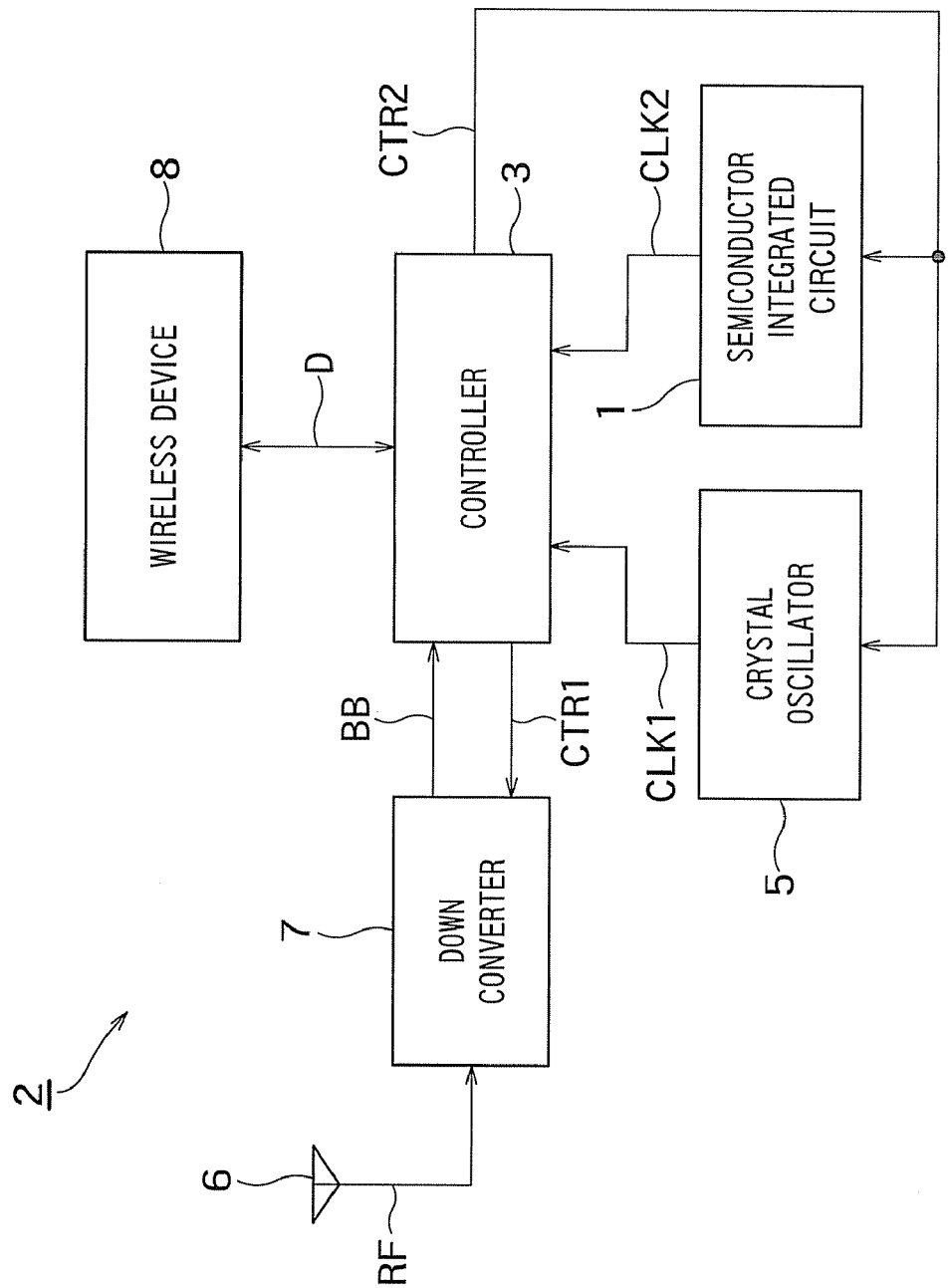
FIG. 8 is a block diagram illustrating a configuration of radio communication apparatus 2 including the semiconductor integrated circuit of the present embodiment.

An application example of the semiconductor integrated circuit of the present embodiment will be explained below. FIG. 8 is a block diagram illustrating a configuration of radio communication apparatus 2 including the semiconductor integrated circuit of the present embodiment.

The semiconductor integrated circuit of the present embodiment can be applied to a wireless communication standard such as Bluetooth™ in which a non-communication time (for example, several milliseconds to tens seconds) is measured. Referring to FIG. 8, the radio communication apparatus 2 includes the semiconductor integrated circuit 1 of FIG. 1, a controller 3, a crystal oscillator 5, an antenna 6, a down converter 7, and a wireless device 8. For example, the controller 3 includes a MPU (Micro Processing Unit) and a SRAM (Static Random Access Memory). For example, the wireless device 8 is a data processing apparatus such as a cellar phone or a personal computer, which supports Bluetooth.

In order to operate the radio communication apparatus 2 in a communication mode, the controller 3 generates a first control signal CTR1 to activate the down converter 7 and a second control signal CTR2 to inactivate the semiconductor integrated circuit 1 and activate the crystal oscillator 5. Then, the controller 3 supplies the first control signal CTR1 to the down converter 7 and the second control signal CTR2 to the semiconductor integrated circuit 1 and the crystal oscillator 5.

In the communication mode, the antenna receives a radio-frequency signal RF which is relatively high-frequency and supplies the received radio-frequency signal RF to the down converter 7. The down converter 7 down-converts the radio-frequency signal RF to a base-band signal BB and supplies the base-band signal BB to the controller 3. The controller 3 converts the base-band signal BB to a data D having a format supported by the wireless device 8 based on a clock CLK 1 of the crystal oscillator 5 and supplies the data D to the wireless device 8. The wireless device 8 performs a predetermined data processing on the data D.

Further, the controller 3 starts to count the clock CLK1 of the crystal oscillator 5 when a down-conversion from the base-band signal BB to the data D is completed. Then, in order to operate the radio communication apparatus 2 in a non-communication mode, the controller 3 generates the first control signal CTR1 to inactivate the down converter 7 and the second control signal CTR2 to activate the semiconductor integrated circuit 1 and inactivate the crystal oscillator 5 when a counted value is equal to a predetermined value (that is, when a predetermined time passes after the down-conversion has been completed). Then, the controller 3 supplies the first control signal CTR1 to the down converter 7 and the second control signal CTR2 to the semiconductor integrated circuit 1 and the crystal oscillator 5.

In non-communication mode, the controller 3 counts a clock CLK2 of the semiconductor integrated circuit 1 (that is, a clock of the output signal Vout of FIG. 1). Then, the controller 3 generates the first control signal CTR1 to activate the down converter 7 and the second control signal CTR2 to inactivate the semiconductor integrated circuit 1 and activate the crystal oscillator 5 when a counted value is equal to a predetermined value (that is, when the non-communication mode has continued for a predetermined time). Then, the controller 3 supplies the first control signal CTR1 to the down converter 7 and the second control signal CTR2 to the semiconductor integrated circuit 1 and the crystal oscillator 5.

As above, in the communication mode, the controller 3 operates based on the clock CLK1 of an output signal of the crystal oscillator 5 which operates at a higher consumed power and a higher speed than the ring oscillator 10. On the other hand, in the non-communication mode, the controller 3 operates based on the clock CLK2 of the output signal (that is, a signal combined by the arithmetic module 24) Vout of the semiconductor integrated circuit 1 including the ring oscillator 10 which operates at a lower consumed power than the crystal oscillator 5. Thereby, a consumed power of the radio communication apparatus 2 can be reduced without an adverse affect to a wireless communication.

Conventionally, an oscillation signal generated by a quartz crystal oscillator is used as a reference clock to measure the non-communication time. However, with the quartz crystal oscillator, the power consumption of the semiconductor integrated circuit is increased, and production cost is also increased.

On the other hand, in the semiconductor integrated circuit of the present embodiment, the output signal Vout in which the noise components such as the flicker noise and the thermal noise are canceled from the first output signal Vout1 to the third output signal Vout3 is used as the reference clock in order to measure the non-communication time. Therefore, the non-communication time can be measured with the circuit having the simple configuration.

Preferably, the semiconductor integrated circuit of the present embodiment is used as a low-frequency oscillator. In the low-frequency oscillator, the noise can hardly be canceled from the signal because an oscillation frequency band overlaps a low frequency band where the noise component which is not up-converted has a relatively strong influence. Accordingly, the semiconductor integrated circuit of the present embodiment is used as the low-frequency oscillator, whereby the noise component can efficiently be reduced while the circuit performance is improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
a ring oscillator comprising:
a first signal generator configured to generate a first output signal having a first phase based on an input signal; and
a second signal generator configured to generate a second output signal having a second phase different from the first phase based on the input signal; and
a noise canceller comprising:
a first amplifier configured to amplify the first output signal generated by the first signal generator using a first amplification factor;
a second amplifier configured to amplify the second output signal generated by the second signal generator using a second amplification factor; and
an arithmetic module configured to combine the first output signal amplified by the first amplifier with the second output signal amplified by the second amplifier.

2. The circuit of claim 1, wherein a ratio of the first amplification factor to the second amplification factor is an integer.

3. The circuit of claim 1, wherein the ring oscillator comprises a plurality of signal generators, each of the signal generators comprising the first signal generator and the second signal generator, and
the noise canceller comprises a plurality of amplifiers equal to the number of the plurality of the signal generators, each of the amplifiers comprising the first amplifier and the second amplifier.

4. The circuit of claim 2, wherein the ring oscillator comprises a plurality of signal generators, each of the signal generators comprising the first signal generator and the second signal generator, and
the noise canceller comprises a plurality of amplifiers equal to the number of the plurality of the signal generators, each of the amplifiers comprising the first amplifier and the second amplifier.

5. The circuit of claim 3, wherein the ring oscillator comprises three signal generators and the noise canceller comprises three amplifiers.

6. The circuit of claim 4, wherein the ring oscillator comprises three signal generators and the noise canceller comprises three amplifiers.

7. The circuit of claim 3, wherein the first amplification factor is "1−n" ("n" is the number of the signal generators) and the second amplification factor is "1".

8. The circuit of claim 4, wherein the first amplification factor is "1−n" ("n" is the number of the signal generators) and the second amplification factor is "1".

9. The circuit of claim 5, wherein the first amplification factor is "1−n" ("n" is the number of the signal generators) and the second amplification factor is "1".

10. The circuit of claim 6, wherein the first amplification factor is "1−n" ("n" is the number of the signal generators) and the second amplification factor is "1".

11. A radio communication apparatus comprising:
a semiconductor integrated circuit comprising:
a ring oscillator comprising a first signal generator configured to generate a first output signal having a first phase based on an input signal, and a second signal generator configured to generate a second output signal having a second phase different from the first phase based on the input signal; and
a noise canceller comprising a first amplifier configured to amplify the first output signal generated by the first signal generator using a first amplification factor, a second amplifier configured to amplify the second output signal generated by the second signal generator using a second amplification factor, and an arithmetic module configured to combine the first output signal amplified by the first amplifier with the second output signal amplified by the second amplifier;
an oscillator configured to operate at a higher speed and a higher consumed power than the ring oscillator; and
a controller configured to operate based on an output signal of the oscillator in a communication mode and on a signal combined by the arithmetic module in a non-communication mode.

12. The apparatus of claim 11, wherein a ratio of the first amplification factor to the second amplification factor is an integer.

13. The apparatus of claim 11, wherein the ring oscillator comprises a plurality of signal generators, each of the signal generators comprising the first signal generator and the second signal generator, and
the noise canceller comprises a plurality of amplifiers equal to the number of the plurality of the signal generators, each of the amplifiers comprising the first amplifier and the second amplifier.

14. The apparatus of claim 12, wherein the ring oscillator comprises a plurality of signal generators, each of the signal generators comprising the first signal generator and the second signal generator, and
the noise canceller comprises a plurality of amplifiers equal to the number of the plurality of the signal generators, each of the amplifiers comprising the first amplifier and the second amplifier.

15. The apparatus of claim 13, wherein the ring oscillator comprises three signal generators and the noise canceller comprises three amplifiers.

16. The apparatus of claim 14, wherein the ring oscillator comprises three signal generators and the noise canceller comprises three amplifiers.

17. The apparatus of claim 13, wherein the first amplification factor is "1−n" ("n" is the number of the signal generators) and the second amplification factor is "1".

18. The apparatus of claim 14, wherein the first amplification factor is "1−n" ("n" is the number of the signal generators) and the second amplification factor is "1".

19. The apparatus of claim 15, wherein the first amplification factor is "1−n" ("n" is the number of the signal generators) and the second amplification factor is "1".

20. The apparatus of claim 11, wherein the controller is configured to activate the oscillator and inactivate the semiconductor integrated circuit in the communication mode, and to inactivate the oscillator and activate the semiconductor integrated circuit in the non-communication mode.

* * * * *